United States Patent
Nakamura

(10) Patent No.: US 6,194,353 B1
(45) Date of Patent: Feb. 27, 2001

(54) PROCESS FOR PREPARING SUPERCONDUCTING THIN FILM FORMED OF OXIDE SUPERCONDUCTOR MATERIAL

(75) Inventor: Takao Nakamura, Osaka (JP)

(73) Assignee: Sumitomo Electric Industries Ltd., Osaka (JP)

(*) Notice: Subject to any disclaimer, the term of this patent is extended or adjusted under 35 U.S.C. 154(b) by 0 days.

(21) Appl. No.: 08/323,065

(22) Filed: Oct. 14, 1994

Related U.S. Application Data

(63) Continuation of application No. 08/044,489, filed on Apr. 9, 1993, now abandoned.

(30) Foreign Application Priority Data

Apr. 10, 1992 (JP) .................................................. 4-118015

(51) Int. Cl.⁷ ..................................................... B05D 3/06
(52) U.S. Cl. .......................... 505/473; 505/732; 505/729; 117/108; 427/62
(58) Field of Search .................................... 505/473, 729, 505/732, 730; 117/108; 427/62, 63, 126.3, 255.3, 314

(56) References Cited

U.S. PATENT DOCUMENTS 5,004,721 * 4/1991 DeLozanne ............................. 505/1
5,143,896 * 9/1992 Harada et al. ......................... 505/1

FOREIGN PATENT DOCUMENTS 0412007 2/1991 (EP) .
0426570 5/1991 (EP) .

OTHER PUBLICATIONS

Kwo et al, Appl. Phys. Lett. 53(26) Dec. 1998, p 2683–2685.*
Wang et al, "High Tc Films by Molecular Beam Epitaxy" EMRS 1991 Spring Meeting (May 27–31, 1991) France, Edited by L. Correra p 549–554.*
Nakayama et al, "In Situ Growth of $B_i$–Sr–Ca–Cu–O Thin Films by Molecular Beam Epitaxy Technique with Pure Ozone", Jpn. J. Appl. Phys. 28(7) Jul. 1989 L1217–1219.*
Nonaka et al, "Preparation of $NdBa_2Cu_3O_{7-\delta}$ films in Ultra-high Vacuum with a $NO_2$ Supersonic Molecular Beam", Appl. Phys. Lett. 57(26) Dec. 1990 p 2850–2852.*
Schuhl et al, "Atomic Layer by Atomic Layer Growth of DyBaCuO Superconducting Thin Film by Molecular Beam Epitaxy", Appl. Phys. Lett. 57(8) Aug. 1990 p 819–821.*

* cited by examiner

Primary Examiner—Roy V. King
(74) Attorney, Agent, or Firm—Miles & Stockbridge P.C.; John C. Kerins

(57) ABSTRACT

A process for preparing an oxide superconductor thin film which has a high crystalline, clean and excellent superconductive surface on a substrate by MBE.

The MBE is effected under a condition that the substrate is heated and an oxidizing gas is locally supplied to the proximity of the substrate so that the pressure of the proximity of the substrate becomes $6 \times 10^{-6}$ to $8 \times 10^{-5}$ Torr at a background pressure.

8 Claims, 4 Drawing Sheets

PROCESS FOR PREPARING SUPERCONDUCTING THIN FILM FORMED OF OXIDE SUPERCONDUCTOR MATERIAL

This application is a continuation of application Ser. No. 08/044,489, filed Apr. 9, 1993, now abandoned.

BACKGROUND OF THE INVENTION

1. Field of the Invention

The present invention relates to a process for preparing superconducting thin film, and more specifically to an improved MBE (Molecular Beam Epitaxy) process particularly for preparing superconducting thin film formed of an oxide material, which has a clean surface, high crystallinity and excellent superconducting properties.

2. Description of Related Art

Oxide superconductors have been considered to have higher critical temperatures than those of metal superconductors, and therefore to have high possibility of practical use. For example, Y—Ba—Cu—O type oxide superconductor has a critical temperature higher than 80 K and it is reported that Bi—Sr—Ca—Cu—O type oxide superconductor and Tl—Ba—Ca—Cu—O type oxide superconductor have critical temperatures higher than 100 K. The oxide superconductor has a crystalline anisotropy in superconducting characteristics, and in particular, its critical current density is maximum in a direction perpendicular to a c-axis of crystal lattice. Therefore, when the oxide superconductor is used, attention should be paid to the crystalline orientation.

In case of applying the oxide superconductor to superconducting electronics including superconducting devices and superconducting integrated circuits, the oxide superconductor has to be used in the form of a thin film. When the oxide superconductor is in the form of a thin film, the above mentioned crystalline anisotropy of superconducting characteristics becomes more remarkable. In addition, to realize high performance superconducting devices and superconducting integrated circuits, two kind of superconducting current paths through one of which superconducting current flows parallel to the substrate and through the other of which superconducting current flows perpendicular to the substrate are necessary. For example, superconducting current flows through a superconducting electrode in the direction parallel to the substrate, flows through an interlayer superconducting current path in the direction perpendicular to the substrate. Therefore, in case of applying the oxide superconductor to superconducting devices and superconducting integrated circuits, a c-axis oriented oxide superconductor thin film of which critical current density is maximum in the direction parallel to the substrate and an a-axis oriented (or b-axis orientated, abbreviated "a-axis oriented" hereinafter) oxide superconductor thin film of which critical current density is maximum in the direction perpendicular to the substrate should be prepared.

The orientation of the oxide superconductor thin film is determined by the film deposition temperature. The film deposition temperature generally means the temperature of the substrate while the oxide superconductor thin film is deposited. An a-axis oriented oxide superconductor thin film can be deposited at the substrate temperature on the order of 50 to 100° C. lower than that of c-axis oriented oxide superconductor thin film.

In order to manufacture superconducting devices and superconducting integrated circuit of multi-layer structure, it is necessary that an a-axis oriented oxide superconductor thin film is stacked on a c-axis oriented oxide superconductor thin film. When the oxide superconductor thin films are stacked, a clean upper surface and high crystallinity are required of the lower oxide superconductor thin film. If the upper surface of the lower oxide superconductor thin film is not clean and contaminants are deposited or oxide is formed on it, the stacked thin films may become physically and electrically discontinuous or an unnecessary weak link of Josephson junction may be formed at the interface. The discontinuity and weak link have adverse effect on the operations of the superconducting device and the superconducting integrated circuit so that their performance become below the determined values or do not operate at all.

The coherence length of the oxide superconductor is very short, therefore, special attention should be given to the contamination of the upper surface of the lower thin film.

In order to clean the surface of the oxide superconductor thin film, in a prior art, the oxide superconductor thin film is heated under a high vacuum so as to vaporize the contaminants. However, oxygen of the oxide superconductor crystalline is unstable and easily escapes when the oxide superconductor thin film is heated under a high vacuum. If some amount of oxygen escapes from the oxide superconductor crystalline, the critical temperature of the oxide superconductor lowers or the oxide superconductor loses its superconductivity.

Therefore, the oxide superconductor thin film which is used a lower layer of a stacked multi-layer structure is required to have a clean outermost surface, high crystallinity and excellent superconducting characteristics.

SUMMARY OF THE INVENTION

Accordingly, it is an object of the present invention to provide a process for preparing an oxide superconductor thin film which has a clean upper surface, high crystallinity and excellent superconducting characteristics, which has overcome the above mentioned defects of the conventional ones.

The above and other objects of the present invention are achieved in accordance with the present invention by a process for preparing a thin film formed of an oxide superconductor on a substrate by MBE characterized in that said MBE is effected under a condition that the substrate is heated and an oxidizing gas is locally supplied to the proximity of the substrate so that the pressure of the proximity of the substrate becomes $6 \times 10^{-6}$ to $8 \times 10^{-5}$ Torr at a background pressure.

In the process in accordance with the present invention, the MBE is preferably effected at a background pressure lower than $1 \times 10^{-9}$ Torr. This quite low background pressure means that there is no leak nor any gas generation in the vacuum chamber of the MBE apparatus. Therefore, no contaminant, for example hydrocarbons and metal carbides, is deposited on the oxide superconductor prepared by the process in accordance with the present invention.

In a preferred embodiment, the oxidizing gas is selected from the group consisting of $O_2$ including 5 to 70 volume percent $O_3$, $N_2O$ and $NO_2$. These gases have higher oxidizing than pure $O_2$ and it is favorable for preparing an oxide superconductor thin film by the MBE.

According to one preferable embodiment of the present invention, the substrate is cooled down to the room temperature after the oxide superconductor thin film was deposited, in the atmosphere in which the oxide superconductor thin film was deposited. While the substrate is cooled down, the oxide superconductor crystal system of the thin film is transformed from a tetragonal system to an orthorhombic system. At this stage, the oxide superconductor thin film should be in the oxidizing atmosphere, in order to get excellent superconducting characteristics.

In one preferred embodiment, the MBE is effected while the oxidizing gas is struck onto a deposition surface of the substrate. By this, the pressure of the oxidizing gas on the deposition surface of the substrate was further elevated.

In a preferred embodiment, the oxide superconductor is formed of a high-$T_c$ (high critical temperature) oxide superconductor, particularly, formed of a high-$T_c$ copper-oxide type compound oxide superconductor for example a Y—Ba—Cu—O type compound oxide superconductor material, a Bi—Sr—Ca—Cu—O type compound oxide superconductor material, and a Tl—Ba—Ca—Cu—O type compound oxide superconductor material.

In case of $Y_1Ba_2Cu_3O_{7-\delta}$ oxide superconductor, the MBE is preferably effected at a substrate temperature of 650 to 730° C. by using metal yttrium, metal barium and metal copper as evaporation sources. It is more preferable that the MBE is effected at a substrate temperature of 700° C. If the substrate temperature is lower than 650° C., the obtained $Y_1Ba_2Cu_3O_{7-\delta}$ oxide superconductor thin film constituted of polycrystals which includes c-axis orientated crystals and a-axis orientated crystals. On the contrary, if the substrate temperature exceeds 730° C., metal copper molecules are not oxidized so that the $Y_1Ba_2Cu_3O_{7-\delta}$ oxide superconductor can not obtained.

The above evaporation sources are preferably set to K cells. It is preferable that the temperature of the K cell of the metal yttrium is 1150 to 1350° C., more preferable 1220° C., the temperature of the K cell of the metal barium is 570 to 640° C., more preferable 620° C., and the temperature of the K cell of the metal copper is 950 to 1090° C., more preferable 1000° C. The temperatures of the K cells are determined by geometric arrangement of the MBE apparatus and the material which constitutes the crucibles.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystallinity.

The above and other objects, features and advantages of the present invention will be apparent from the following description of preferred embodiments of the invention with reference to the accompanying drawings.

DESCRIPTION OF THE PREFERRED EMBODIMENTS

Figure 1:
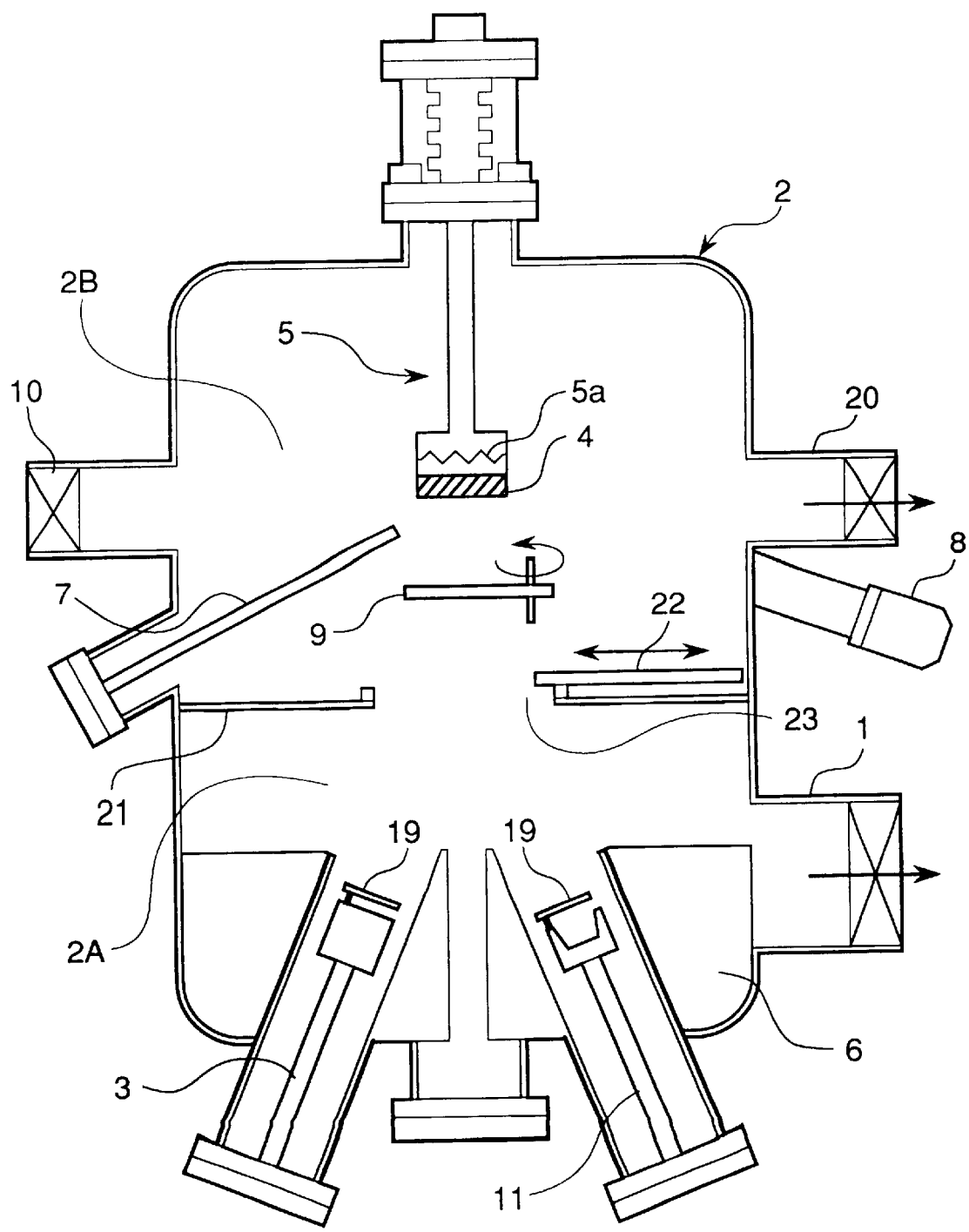
FIGS. 1 is a diagrammatic sectional view of a film deposition apparatus which can be used for carrying out the process in accordance with the present invention.

Referring to FIG. 1 there is shown a diagrammatic sectional view of a film deposition apparatus which can be used for carrying out the process in accordance with the present invention. This film deposition apparatus is disclosed by Takao Nakamura in U. S. patent application Ser. No. 07/987,756, filed Dec. 9, 1992, now abandoned.

The shown film deposition apparatus basically includes a vacuum chamber 2 provided with a main evacuating apparatus 1, at least one K (Knudsen's) cell and at least one electron beam gun 11 provided at a bottom of the vacuum chamber 2, and a sample holder 5 provided at a top of the vacuum chamber 2 for holding a substrate 4 on which a film is to be deposited. The sample holder 5 is associated with a heater 5a for heating the substrate. In addition, the vacuum chamber 2 is also provided with a port 10 for exchanging a sample, a liquid nitrogen shroud 6 for forming a cold trap around an evaporation source of the K cell, and a RHEED (Reflecting High Energy Electron Diffraction) device 8 for observing a thin film roughness during the deposition. In front of the substrate held by the sample holder, a shutter 9 is located for controlling a deposition time during the deposition process. The K cell 3 and the electron beam gun 11 are provided with an openable shutter 19.

In addition, a gas supplying apparatus 7 is provided so as to introduce an oxidizing gas such as $O_2$, $O_3$, $NO_2$, $N_2O$, etc. in proximity of the substrate 4 held by the sample holder 5, so that the oxidizing gas can be supplied to form an oxygen-enriched atmosphere in the proximity of the substrate 4 in order to oxidize metal molecular beams incoming from the evaporation source in the course of the film deposition.

Furthermore, the film deposition apparatus additionally includes a partition wall 21 for dividing the vacuum chamber 2 into a first sub-chamber 2A which is constituted of a lower portion of the vacuum chamber defined below the partition wall 21 and which is coupled to the K cell 3, the electron beam gun 11 and the main evacuating apparatus 1, and a second sub-chamber 2B which is constituted of an upper portion of the vacuum chamber defined above the partition wall 21 and in which sample holder 5 is located. The partition wall 21 includes a through opening 23 formed at a center thereof. The position of the opening 23 is determined to ensure that a beam emitted from K cell 3 and the electron beam gun 11 toward the substrate 4 is not obstructed by the partition wall 21. In addition, the size of the opening 23 is determined to enable restricted molecular flows between the first sub-chamber 2A and the second sub-chamber 2B so that a pressure difference can be created between the first sub-chamber 2A and the second sub-chamber 2B when the opening 23 is open. Therefore, the partition wall 21 having the through opening 23 constitutes a vacuum impedance.

A gate valve 22 is provided on the partition wall 21 for hermetically closing the opening 23 of the partition wall 21, so as to completely shut off the molecular flows between the first sub-chamber 2A and the second sub-chamber 2B when the gate valve 22 is closed. An opening and closing of this gate valve 22 is controlled from the outside of the film deposition apparatus by a not-shown means.

In addition, an auxiliary evacuating apparatus 20 is coupled to the second sub-chamber 2B for evacuating the second sub-chamber 2B to an ultra-high vacuum when the gate valve 22 is closed. The auxiliary evacuating apparatus 20 is constituted of a cryopump. On the other hand, the main evacuating apparatus 1 is constituted of a diffusion pump.

EXAMPLE

A thin film of $Y_1Ba_2Cu_3O_{7-\delta}$ oxide superconductor was prepared by using the apparatus of FIG. 1.

First, an MgO (100) substrate 4 was set to the sample holder 5, and metal yttrium, metal barium and metal copper were set to three K cells 3 as evaporation sources.

Thereafter, the chamber 2 was closed and the gate valve 22 was opened. The vacuum chamber 2 was evacuated by the main evacuating apparatus 1 and the auxiliary evacuating apparatus 20 to an ultra-high vacuum of which the pressure was lower than $1\times10^{-9}$ Torr in which background pressure the film deposition by the MBE process was available. Succeedingly, $O_2$ gas including 8 volume percent $O_3$ was supplied from the gas supplying device 7 so that the pressure in the second chamber 2B became $5\times10^{-5}$ Torr. As mentioned above, the vacuum chamber 2 was provided with the vacuum impedance (the partition wall 21 having the through opening 23), a pressure difference of about one digit or more was created between the first sub-chamber 2A and the second sub-chamber 2B. In addition, the oxidizing gas jetted from the gas supplying device 7 was struck onto a deposition surface of the substrate, the pressure of the oxidizing gas on the deposition surface of the substrate was further elevated.

Then, the substrate 4 was heated by the heater 5a to a temperature of 700° C. The K cell 3 of metal yttrium was heated to a temperature of 1220° C., the K cell 3 of metal barium was heated to a temperature of 620° C. and the K cell 3 of metal copper was heated to a temperature of 1000° C. When molecular beams had become to be stably generates from the evaporation sources, the shutters 9 and 19 were opened so as to start deposition of the oxide superconductor thin film onto the substrate 4. At this time, a surface roughness of this deposited film was observed by the RHEED device. The oxide superconductor thin film was grown up to a thickness of 90 nanometers at a deposition rate of 1 nanometer/minute. The deposition rate is preferably 0.5 to 2 nanometers/minute.

When the oxide superconductor thin film has reached a thickness of 90 nanometers, the substrate 4 was cooled down to the room temperature. While the substrate 4 was cooled down, it was maintained in the condition in which the oxide superconductor thin film was deposited.

After the oxide superconductor thin film was obtained, crystal structure and surface condition of the oxide superconductor thin film was evaluated LEED and XPS without exposing the oxide superconductor thin film to the air. It became clear that the oxide superconductor thin film was a c-axis orientated $Y_1Ba_2Cu_3O_{7-\delta}$ oxide superconductor thin film. The results are shown in FIGS. 2 to 4.

Figure 2:
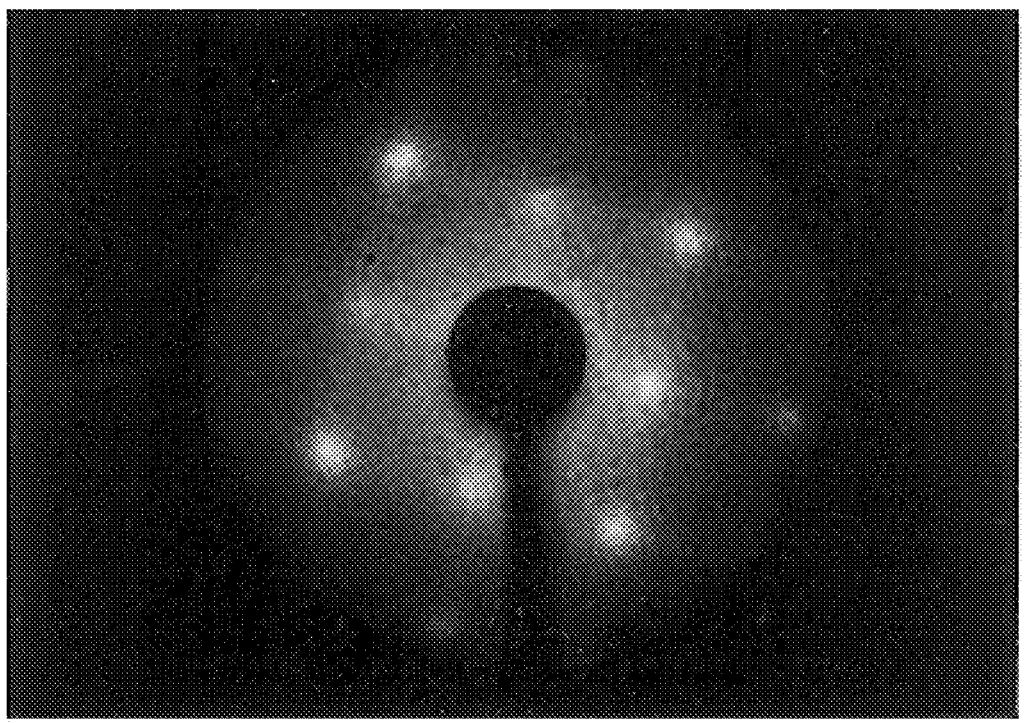
FIGS. 2 is a LEED (Low Energy Electron Diffraction) image of an oxide superconductor thin film prepared by the process in accordance with the present invention.

FIG. 2 shows a LEED image of the oxide superconductor thin film prepared by the above process in accordance with the present invention. In FIG. 2, some spots are observed. This reveals such a fact that the oxide superconductor thin film has a crystalline surface.

Figure 3:
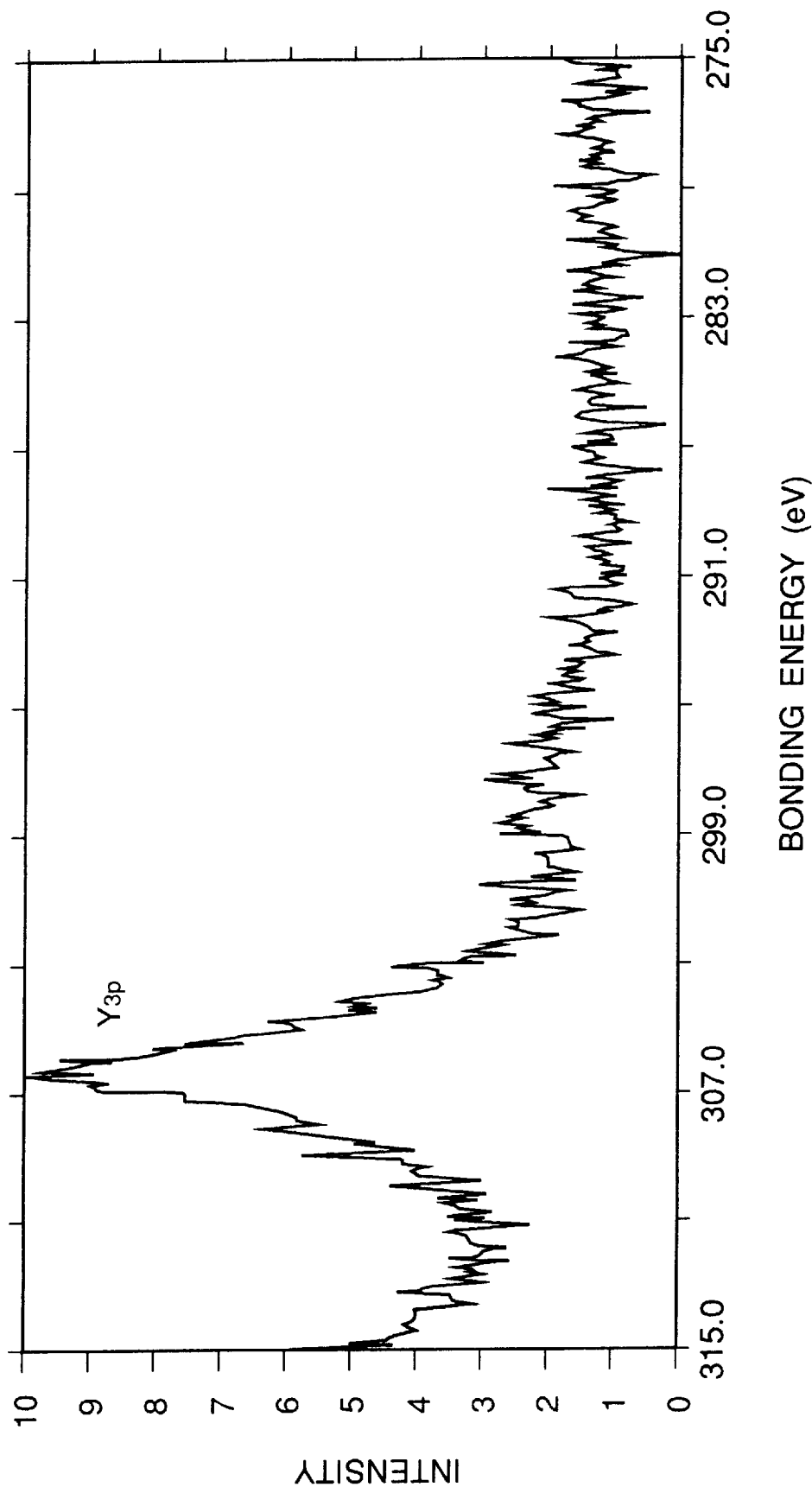
FIGS. 3 and 4 are XPS (X-ray Photoelectron Spectroscopy) spectra of an oxide superconductor thin film prepared by the process in accordance with the present invention.
Figure 4:
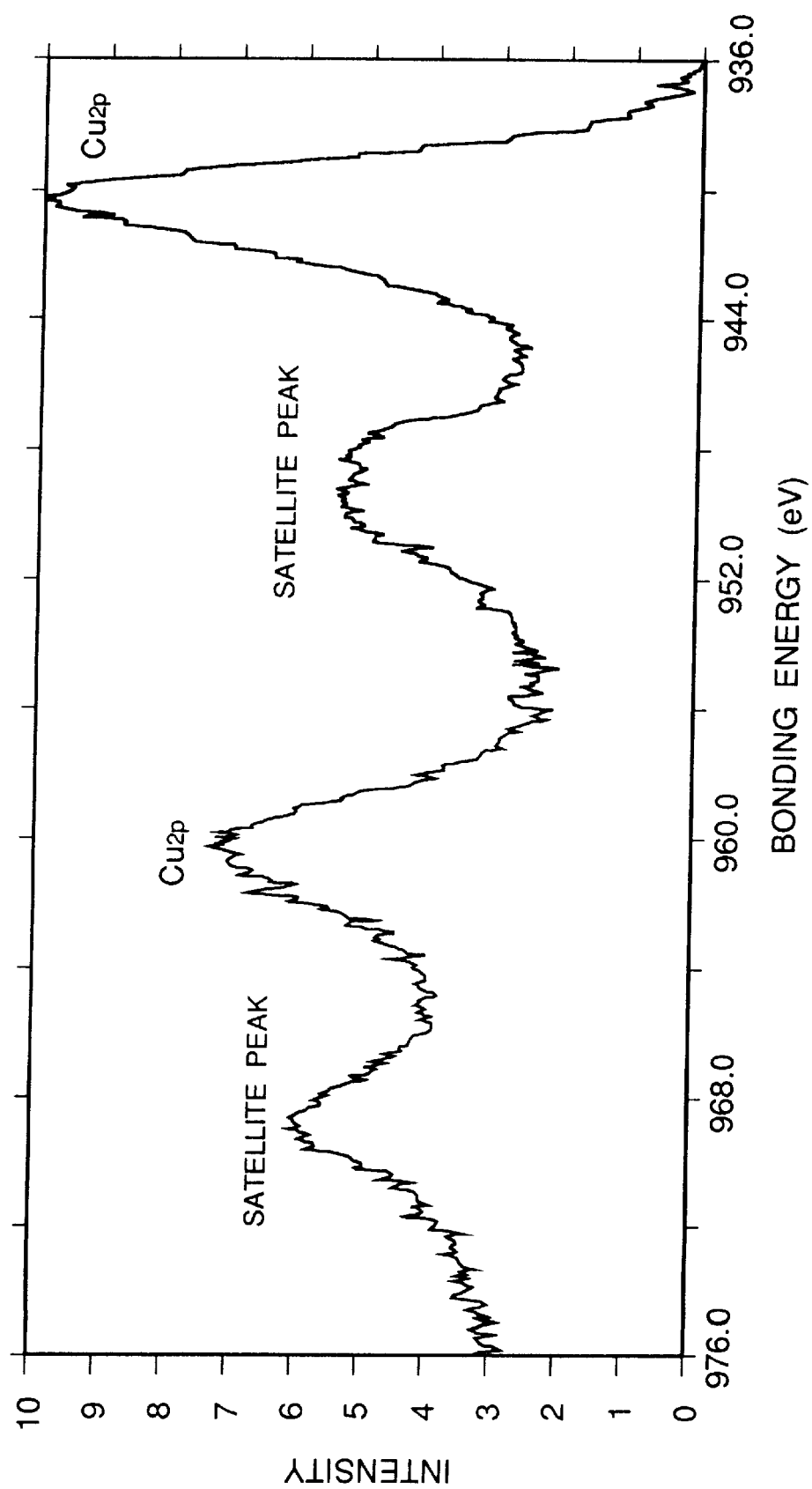

FIGS. 3 and 4 shows XPS spectra of the oxide superconductor thin film prepared by the above process in accordance with the present invention. FIG. 3 shows XPS spectra in a range in which 3p peak of yttrium and a peak of C can be observed. In FIG. 3, no peak of C can be observed. Therefore, there is no composition of C which is a contaminant on the surface of the oxide superconductor thin film prepared by the above process in accordance with the present invention and the surface is clean.

FIG. 4 shows XPS spectra in a range in which peaks of Cu can be observed. In FIG. 4, intensive satellite peaks of Cu can be observed. This reveals such a fact that the surface of the oxide superconductor thin film prepared by the above process in accordance with the present invention has excellent superconductivity.

As explained above, an oxide superconductor thin film which has an excellent surface condition can be obtained without any post-deposition treatment by the process in accordance with the present invention. The oxide superconductor thin film prepared by the process in accordance with the present invention has a high crystalline, clean and excellent superconductive surface. Therefore, the oxide superconductor thin film is suitable for a lower layer of a stacked films.

The invention has thus been shown and described with reference to the specific embodiments. However, it should be noted that the present invention is in no way limited to the details of the illustrated structures but converts and modifications may be made within the scope of the appended claims.

What is claimed is:

1. A process for preparing a film formed of $Y_1Ba_2Cu_3O_{7-\delta}$ oxide superconductor having a clean, crystalline and superconductive surface as grown on a substrate by MBE wherein said process comprises conducting said MBE in an MBE apparatus having a vacuum chamber in which pressure around the substrate is elevated while maintaining lower pressure near an evaporation source, wherein said lower pressure is a pressure less than said pressure around the substrate, under a condition that the substrate is heated to a temperature of 650 to 730° C. an oxidizing gas is locally supplied to the proximity of the substrate so that the pressure in the proximity of the substrate becomes $6\times10^{-6}$ to $8\times10^{-5}$ Torr at a background pressure of lower than $1\times10^{-9}$ Torr and using metal yttrium, metal barium and metal copper as evaporation sources set to K cells, wherein a temperature of the K cell of the metal yttrium is in the range of 1150 to 1350° C., a temperature of the K cell of the metal barium is in the range of 570 to 640° C., and a temperature of the K cell of the metal copper is in the range of 950 to 1090° C., wherein said thin film is deposited at a deposition rate in the range of 0.5 to 2 nanometers/minute.

2. A process claimed in claim 1 wherein the oxidizing gas is selected from the group consisting of $O_2$ including 5 to 70 volume percent $O_3$, $N_2O$ and $NO_2$.

3. A process claimed in claim 1 wherein the substrate is cooled down to the room temperature after the oxide superconductor film was deposited, in the atmosphere in which the oxide superconductor film was deposited.

4. A process claimed in claim 1 wherein the MBE is effected while the oxidizing gas is struck onto a deposition surface of the substrate.

5. A process as claimed in claim 1 wherein the MBE is effected at a substrate temperature of 700° C.

6. A process as claimed in claim 1 wherein the MBE is effected at a temperature of the K cell of the metal yttrium of 1220° C., at a temperature of the K cell of the metal barium of 620° C. and at a temperature of the K cell of the metal copper of 1000° C.

7. A process for preparing a film formed of an oxide superconductor having a clean, crystalline and superconductive surface as grown on a substrate by molecular beam epitaxy, the process comprising the steps of:

placing said substrate in a vacuum chamber;

heating said substrate to a temperature in the range of 650° C. to 750° C.;

locally supplying an oxidizing gas in the proximity of the substrate to produce a pressure in a first region of said vacuum chamber in proximity to the substrate in the range of 6×10−6 to 8×10−5 Torr at a background pressure of lower than 1×10−9 Torr; and maintaining a pressure differential between said first region of said vacuum chamber in proximity to said substrate and a second region of said vacuum chamber near an evaporation source, wherein a pressure in said second region is maintained at a pressure lower than the pressure in the first region of said vacuum chamber, wherein said film is deposited at a deposition rate in the range of 0.5 to 2 nanometers/minute.

8. A process for preparing a film formed of $Y_1Ba_2Cu_3O_{7-\delta}$ oxide superconductor having a clean, crystalline and superconductive surface as grown on a substrate by MBE wherein said process comprises conducting said MBE in an MBE apparatus having a vacuum chamber in which pressure around the substrate is elevated while maintaining lower pressure near an evaporation source, wherein said lower pressure is a pressure less than said pressure around the substrate, under a condition that the substrate is heated to a temperature of 650 to 730° C. an oxidizing gas is locally supplied to the proximity of the substrate so that the pressure in the proximity of the substrate becomes $6 \times 10^{-6}$ to $8 \times 10^{-5}$ Torr at a background pressure of lower than $1 \times 10^{-9}$ Torr and using metal yttrium, metal barium and metal copper as evaporation sources set to K cells, wherein a temperature of the K cell of the metal yttrium is in the range of 1150 to 1350° C., a temperature of the K cell of the metal barium is in the range of 570 to 640° C., and a temperature of the K cell of the metal copper is in the range of 950 to 1090° C., wherein said thin film is deposited at a deposition rate of one (1) nanometer/minute.

* * * * *